United States Patent
Okuyama et al.

(10) Patent No.: US 9,236,583 B2
(45) Date of Patent: Jan. 12, 2016

(54) ORGANIC ELECTROLUMINESCENT ELEMENT AND PLANAR LIGHT-EMITTING UNIT

(71) Applicant: Konica Minolta, Inc., Tokyo (JP)

(72) Inventors: Masato Okuyama, Odawara (JP); Masakazu Tonishi, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/355,411

(22) PCT Filed: Oct. 3, 2012

(86) PCT No.: PCT/JP2012/075691
§ 371 (c)(1),
(2) Date: Apr. 30, 2014

(87) PCT Pub. No.: WO2013/073302
PCT Pub. Date: May 23, 2013

(65) Prior Publication Data
US 2014/0306211 A1    Oct. 16, 2014

(30) Foreign Application Priority Data
Nov. 14, 2011 (JP) ................. 2011-248932

(51) Int. Cl.
*H01L 51/52* (2006.01)
*H01L 27/32* (2006.01)

(52) U.S. Cl.
CPC ......... *H01L 51/5253* (2013.01); *H01L 27/3239* (2013.01); *H01L 2251/5338* (2013.01); *Y02E 10/549* (2013.01)

(58) Field of Classification Search
CPC .............. H01L 51/5253; H01L 51/525; H01L 51/5256; H01L 2251/5338; H01L 27/3239; Y02E 10/549
See application file for complete search history.

(56) References Cited

U.S. PATENT DOCUMENTS

| 2002/0030770 A1 | 3/2002 | Tsutsui et al. |
| 2004/0061437 A1 | 4/2004 | Ikagawa |

(Continued)

FOREIGN PATENT DOCUMENTS

| JP | H11-283752 | 10/1999 |
| JP | 2002-040964 A | 2/2002 |

(Continued)

OTHER PUBLICATIONS

The Extended European Search Report dated Oct. 6, 2015 issued from the corresponding European Patent Application No. 12850585.6.

*Primary Examiner* — Yasser A Abdelaziez
(74) *Attorney, Agent, or Firm* — Lucas & Mercanti, LLP

(57) ABSTRACT

Provided is an organic EL element, wherein the thickness of the organic EL element can be made small and the width of a seal can be made narrower, and change in light-emitting quality over time can be inhibited. The organic EL element (1) is configured to be provided with: a second electrode (13) provided so as to cover an organic compound layer (12); an inorganic insulation film (15) formed within a prescribed area within a non light-emitting area of a first electrode (11), and formed between the first electrode (11) and the second electrode (13); an inorganic film (14) provided so as to cover the second electrode (13); a sealing resin layer (3) provided so as to cover the inorganic film (14); and a sealing base material (4) provided upon the sealing resin layer (3).

10 Claims, 3 Drawing Sheets

(56) References Cited

U.S. PATENT DOCUMENTS

| | | |
|---|---|---|
| 2004/0079941 A1 | 4/2004 | Yamazaki et al. |
| 2004/0135503 A1 | 7/2004 | Handa et al. |
| 2005/0088089 A1 | 4/2005 | Tsutsui et al. |
| 2005/0224935 A1* | 10/2005 | Schaepkens et al. ......... 257/678 |
| 2006/0108913 A1 | 5/2006 | Cok |
| 2008/0315758 A1 | 12/2008 | Tsutsui et al. |
| 2011/0260201 A1* | 10/2011 | Klein et al. .................... 257/99 |
| 2015/0068600 A1* | 3/2015 | Fujimoto .............. C23C 16/401 136/259 |

FOREIGN PATENT DOCUMENTS

| | | | |
|---|---|---|---|
| JP | 2004-111158 A | | 4/2004 |
| JP | 2005-100815 A | | 4/2005 |
| JP | 2005-353501 A | | 12/2005 |
| JP | 2007-059094 A | | 3/2007 |
| JP | 2007-311219 A | | 11/2007 |
| KR | 20090128301 | | 12/2009 |
| WO | 2009115955 | | 9/2009 |
| WO | WO2010009716 | * | 1/2010 |
| WO | WO2013132889 | * | 9/2013 |

* cited by examiner

FIG. 4

| SAMPLE | CATHODE (SECOND ELECTRODE) MATERIAL | CATHODE (SECOND ELECTRODE) THICKNESS (nm) | INORGANIC FILM MATERIAL | INORGANIC FILM THICKNESS (nm) | ADHESIVE LAYER MATERIAL | ADHESIVE LAYER THICKNESS | INITIAL DS GENERATION RATIO | TIME-DEPENDENT DS GENERATION RATIO | FLEXIBILITY |
|---|---|---|---|---|---|---|---|---|---|
| EXAMPLE 1 | Al | 300 | SiNx | 200 | EPOXY-BASED | 20 μm | A | A | A |
| EXAMPLE 2 | In₂O₃-ZnO | 200 | SiNx | 200 | EPOXY-BASED | 20 μm | A | A | A |
| EXAMPLE 3 | Al (EB EVAPORATION) | 300 | SiNx | 200 | EPOXY-BASED | 20 μm | A | A | A |
| EXAMPLE 4 | Al | 300 | SiO₂ | 200 | EPOXY-BASED | 20 μm | A | A | A |
| EXAMPLE 5 | Al | 300 | SiNx | 90 | EPOXY-BASED | 20 μm | C | B | A |
| EXAMPLE 6 | Al | 1000 | SiNx | 2000 | EPOXY-BASED | 20 μm | B | C | B |
| EXAMPLE 7 | Al | 300 | SiNx | 2000 | EPOXY-BASED | 20 μm | B | C | B |
| EXAMPLE 8 | Al | 1000 | SiNx | 1000 | ACRYLIC | 20 μm | B | D | B |
| COMPARATIVE EXAMPLE | Al | 1000 | SiNx | 1000 | — | — | B | D | C |

ORGANIC ELECTROLUMINESCENT ELEMENT AND PLANAR LIGHT-EMITTING UNIT

CROSS REFERENCE TO RELATED APPLICATION

This Application is a 371 of PCT/JP2012/075691 filed on Oct. 3, 2012 which, in turn, claimed the priority of Japanese Patent Application No. JP2011-248932 filed on Nov. 14, 2011 both applications are incorporated herein by reference.

TECHNICAL FIELD

The present invention relates to an organic electroluminescent element applicable to applications such as a display device and a lighting device, and relates to a planar light-emitting unit produced by arranging a plurality of the organic electroluminescent elements.

BACKGROUND ART

In recent years, an organic electroluminescent element (hereinafter, referred to as an organic EL element) using an organic material has been regarded as promising, for example, in applications such as an inexpensive large-area full-color display device of a solid-state light-emitting type and a light-emitting element of a writing light source array, and the research and development of organic EL elements have been actively promoted.

The organic EL element is, generally, a thin film-type element that is provided with a substrate, a first electrode, an organic compound layer including a light-emitting layer, and a second electrode, and is a thin film-type element in which the first electrode, the organic compound layer and the second electrode are formed on the substrate in this order. Meanwhile, one of the first electrode and the second electrode constitutes an anode and the other constitutes a cathode. In addition, the light-emitting layer is constituted of one or a plurality of organic layers containing an organic light-emitting material.

In the organic EL element having such a configuration, when a voltage is applied between the first electrode and the second electrode, holes are injected into the light-emitting layer from one electrode (anode) and electrons are injected into the light-emitting layer from the other electrode (cathode). Then, the hole and the electron injected in the light-emitting layer recombine in the light-emitting layer, and thus the energy level of the organic light-emitting material returns from the conduction band to the valence band. The energy generated at this time is released as light from the light-emitting layer.

In the organic EL element that emits light based on the above-mentioned principle, a non light-emitting point called a dark spot expands over time in the light-emitting surface. The expansion phenomenon of the dark spot is generated due to the deterioration of the electrode, organic layer (light-emitting layer) or the like of the organic EL element, by permeation of oxygen or water vapor from the outside. Therefore, in order to prevent such permeation of oxygen or water vapor into the organic EL element, conventionally, various sealing technologies of the organic EL element are proposed (for example, see Patent Literatures 1 and 2).

In Patent Literature 1, a technique of providing a sealing film on an element substrate of an organic EL element is proposed. Furthermore, in Patent Literature 2, a technique of forming an inorganic sealing film on an element substrate of an organic EL element, and furthermore, sticking a sealing member on the inorganic sealing film via a sealing member is proposed.

CITATION LIST

Patent Literature

PTL 1: Japanese Patent Laid-Open No. 2005-100815
PTL 2: Japanese Patent Laid-Open No. 2007-59094

SUMMARY OF INVENTION

Technical Problem

Meanwhile, in recent years, flexibility has been demanded in the technical field of the organic EL element and furthermore, also in organic EL elements having flexibility, the development of a sealing technology for securing good sealing performance (light-emitting performance) has been expected.

The present invention has been made in order to meet the above-mentioned requests, and an object according to one aspect of the present invention is to provide an organic EL element having characteristics excellent in both flexibility and light-emitting performance, and a planar light-emitting unit provided with the same.

Solution to Problem

In order to solve the above-mentioned problem, the organic EL element of the present invention is provided with an element substrate, a first electrode formed on the element substrate, an organic compound layer that is formed on the first electrode and includes a light-emitting layer, and a second electrode provided so as to cover the organic compound layer. Furthermore, the organic EL element of the present invention is provided with an inorganic insulation film formed on a prescribed area within a non light-emitting area of the first electrode and formed between the first electrode and the second electrode, an inorganic film provided so as to cover the second electrode, a sealing resin layer provided so as to cover the inorganic film, and a sealing base material provided on the sealing resin layer.

Furthermore, the planar light-emitting unit of the present invention is constituted to be provided with a plurality of the organic EL elements of the present invention, and a support member that supports the plurality of organic EL elements arranged in a prescribed form.

Effects of Invention

As mentioned above, the organic EL element of the present invention has a structure in which the organic compound layer is covered with three layers of the second electrode, the inorganic film and the sealing resin layer, that is, a three-layer sealing structure. In this case, even when the thickness of each layer is made smaller, sufficient sealing performance can be secured. Therefore, according to the present invention, an organic EL element having characteristics excellent in both flexibility and light-emitting performance, and a planar light-emitting unit provided with the same can be provided by adopting such a sealing configuration.

BRIEF DESCRIPTION OF DRAWINGS

FIG. 4 shows a diagram showing the results of characteristic evaluations of organic EL elements in various Examples.

DESCRIPTION OF EMBODIMENTS

First, before explaining the configuration of the organic EL element of the present embodiment, the problem to be solved by the present invention will be explained more specifically.

As mentioned above, conventionally, sealing technologies of providing a sealing film (inorganic sealing film) or a sealing member on the element substrate of the organic EL element are proposed, but actually, it is difficult to obtain a good sealing performance only by the sealing technology. Therefore, under the existing circumstances, a goof sealing performance (light-emitting performance) is obtained by, for example, broadening the width of a seal of the organic EL element (sealing width: the distance from the end portion of the light-emitting area of the light-emitting layer to the side wall part of the organic EL element). However, when the width of a seal is broadened, the area of a non light-emitting area formed within an area near the outer peripheral end part of the light-emitting surface of the organic EL element, increases.

Moreover, as another technique of preventing permeation of moisture from the outside, a technique is considered, in which the thickness of the electrode (second electrode) provided on the side of the light-emitting layer opposite to a light extraction side is increased and an organic layer is protected from the external world. However, flexibility of the organic EL element deteriorates in the technique. Furthermore, in the technique, a harmful effect of the second electrode easily peeling from the element substrate is caused when the thickness of the second electrode is too large.

From various problems mentioned above, it is difficult to obtain an organic EL element having characteristics excellent in both flexibility and light-emitting performance only by the simple application of the above-mentioned sealing technology to organic EL elements for which flexibility are required. Accordingly, in the present invention, a sealing technology which can suppress temporal change (deterioration) in the quality of light emission without increasing the width of a seal and the thickness in an organic EL element for which flexibility is required, is proposed.

<1. Configuration of Organic EL Element>

Hereinafter, an example of the organic EL element according to an embodiment of the present invention will be explained specifically with reference to the drawings, but the present invention is not limited to the example described below.

[Overall Configuration of Organic EL Element]

Figure 1:
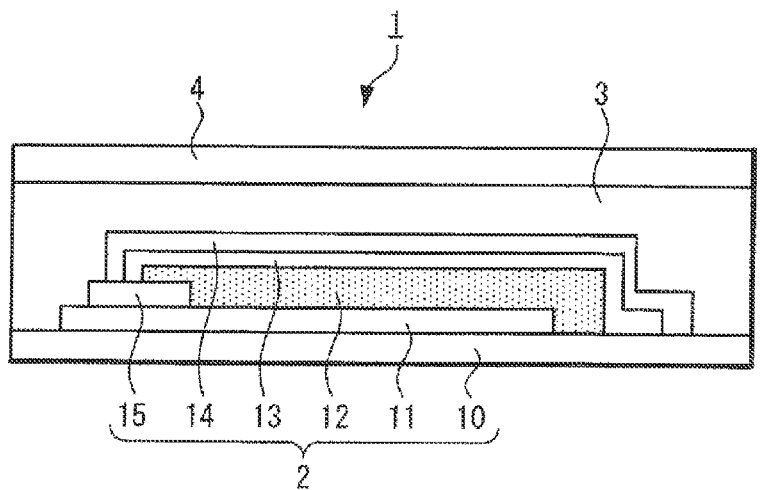
FIG. 1 is a schematic configuration sectional view of the organic EL element according to an embodiment of the present invention.

In FIG. 1, a schematic configuration sectional view of the organic EL element according to an embodiment of the present invention is shown. An organic EL element 1 in the present embodiment is an organic EL element having flexibility, and is provided with an organic EL element main body 2, an adhesive layer 3 (sealing resin layer), and a sealing base material 4.

In the present embodiment, the organic EL element 1 is produced by sticking the sealing base material 4 with the organic EL element main body 2 via the adhesive layer 3. That is, the organic EL element 1 of the present embodiment is produced by a sealing technique of a solid-state close adhesion type. Meanwhile, at this time, although not shown in FIG. 1, the sealing base material 4 is stuck with the organic EL element main body 2 via the adhesive layer 3 so that end parts of external extraction electrodes of an anode 11 and a cathode 13 are exposed outside.

The organic EL element main body 2 is provided with an element substrate 10, an anode 11 (first electrode), an organic compound layer 12 including a light-emitting layer, a cathode 13 (second electrode), an inorganic film 14 and an inorganic insulation film 15. In the present embodiment, the anode 11, the organic compound layer 12, the cathode 13 and the inorganic film 14 are stacked on the element substrate 10 in this order.

Meanwhile, at this time, the cathode 13 is formed so as to cover the organic compound layer 12, and the inorganic film 14 is formed so as to cover the cathode 13. That is, the organic EL element 1 in the present embodiment has a configuration of sealing the organic compound layer 12 by the use of the three layers of the cathode 13, the inorganic film 14 and the adhesive layer 3 (three-layer sealing configuration). Therefore, in the organic EL element 1 in the present embodiment, a sufficient sealing performance can be obtained even when each thickness of the cathode 13, the inorganic film 14 and adhesive layer 3 is made smaller.

Further, by adopting the sealing configuration, not only the upper face of the organic compound layer 12 (surface of the sealing base material 4 side), but also the side faces are also sealed with the cathode 13, the inorganic film 14 and the adhesive layer 3. Therefore, in the present embodiment, the width of a seal of the organic EL element 1 can be made narrower (non light-emitting area can be reduced). That is, in the organic EL element 1 in the present embodiment, the temporal change (deterioration) in light emission qualities can be suppressed without increasing the width of a seal and the thickness (while securing flexibility).

In addition, the inorganic insulation film 15 is, as shown in FIG. 1, formed on an area near the outer peripheral end part of the anode 11, that is, on a prescribed area within a non light-emitting area of the anode 11, and is provided between the anode 11 and the cathode 13. In the present embodiment, the insulation between the anode 11 and the cathode 13 is secured by the inorganic insulation film 15 (electric short circuit between the anode 11 and the cathode 13 is prevented).

Meanwhile, in the organic EL element 1 in the present embodiment, light radiated from the light-emitting layer (organic compound layer 12) may be extracted only from the anode 11 side, or may be extracted from both the anode 11 and the cathode 13 sides. Furthermore, in the present embodiment, emitting-light may be extracted only from the cathode 13 side.

The organic compound layer 12, although not shown in FIG. 1, is provided with, for example, various organic layers such as an injection layer, a blocking layer and a transport layer of carriers (holes and electrons), also other than the light-emitting layer, and is constituted by stacking these various organic layers. The configuration of each of these organic layers will be mentioned in detail later.

Meanwhile, examples of preferable stacked configurations of the organic EL element 1 are as follows.

(1) element substrate/anode/light-emitting layer/electron transport layer/cathode/inorganic film/adhesive layer/sealing base material (2) element substrate/anode/hole transport layer/light-emitting layer/hole blocking layer/electron transport layer/cathode/inorganic film/adhesive layer/sealing base material (3) element substrate/anode/hole transport layer (hole injection layer)/light-emitting layer/hole blocking layer/electron transport layer/electron injection layer (cathode buffer layer)/cathode/inorganic film/adhesive layer/sealing base material (4) element substrate/anode/hole injection layer (anode buffer layer)/hole transport layer/light-emitting layer/hole blocking layer/electron transport layer/electron injection layer (cathode buffer layer)/cathode/inorganic film/adhesive layer/sealing base material Hereinafter, configurations of respective portions and respective layers of the organic EL element 1 shown in FIG. 1 will be explained more specifically.

[Element Substrate]

The element substrate 10 (base body, substrate, base material, support) can be formed of, for example, a transparent material such as glass or plastic. In particular, preferably the element substrate 10 is constituted of a glass substrate, a quartz substrate or a flexible base material. It is possible to use a transparent resin film, a thin film glass or the like, as the flexible base material.

It is possible to use, as the material for forming the transparent resin film, for example, polyester such as polyethylene terephthalate (PET) or polyethylene naphthalate (PEN). Furthermore, it is possible to use, as the material for forming the transparent resin film, for example, a material such as polyethylene, polypropylene or cellophane. Moreover, it is possible to use, as the material for forming the transparent resin film, cellulose esters such as cellulose diacetate, cellulose triacetate, cellulose acetate butyrate, cellulose acetate propionate (CAP), cellulose acetate phthalate (TAC) and cellulose nitrate, or derivatives thereof.

In addition, it is possible to use, as the material for forming the transparent resin film, for example, a material such as polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyether imide, polyether ketone imide, polyamide, fluororesin, nylon, polymethyl methacrylate, acrylic or polyacrylates. Furthermore, it is also possible to use a cycloolefin-based resin, for example, referred to as ARTON (registered trade mark: manufactured by JSR) or APEL (registered trade mark: manufactured by Mitsui Chemicals, Inc.), as a material for forming the transparent resin film.

When the element substrate 10 is constituted of a transparent resin film, a film including an inorganic material, a film including an organic material or a hybrid film in which these films are stacked may be provided on the surface of the transparent resin film, in order to suppress the permeation of, for example, water vapor, oxygen or the like into the organic EL element 1. In this case, the above-mentioned film is preferably constituted of a barrier film that gives a value of a water vapor transmission rate (environmental conditions: 25±0.5° C., relative humidity (90±2)% RH) of about 0.01 g/[$m^2$·day·atm] or less. In addition, the above-mentioned film is more preferably constituted of a barrier film that gives a value of an oxygen transmission rate of about $10^{-3}$ $cm^3$/[$m^2$·day·atm] or less and a value of a water vapor transmission rate of about $10^{-3}$ g/[$m^2$·day·atm] or less. Furthermore, the above-mentioned film is particularly preferably constituted of a barrier film that gives a value of an oxygen transmission rate of about $10^{-3}$ g/[$m^2$·day·atm] or less and a value of water vapor transmission rate of about $10^{-5}$ g/[$m^2$·day·atm] or less. Meanwhile, the "water vapor transmission rate" used in the present specification is a value measured by an infrared sensor method in accordance with JIS (Japanese Industrial Standards)-K7129 (1992), and the "oxygen transmission rate" is a value measured by a coulometric method in accordance with JIS-K7126 (1987).

It is possible to use any material as the material for forming the above-mentioned barrier film (above-mentioned covering film), as long as the material is a material capable of suppressing infiltration of factors such as moisture and oxygen, which causes the deterioration of the organic EL element 1, into the organic EL element 1. For example, the barrier film can be constituted of a covering film including an inorganic material such as silicon oxide, silicon dioxide, or silicon nitride. Meanwhile, in order to improve brittleness of the barrier film, the barrier film is preferably constituted of a hybrid covering film in which a covering film including the above-mentioned inorganic material and a covering film including an organic material are stacked. In this case, the covering film including the inorganic material and the covering film including an organic material are stacked in an arbitrary order, and the both films are preferably stacked alternately a plurality of times.

Any technique can be used as techniques for forming the barrier film, as long as it is a technique capable of forming the barrier film on the element substrate 10 (transparent resin film). It is possible to use, for example, a technique such as a vacuum evaporation method, a sputtering method, a reactive sputtering method, a molecular beam epitaxial method, a cluster ion beam method, an ion plating method, a plasma polymerization method, an atmospheric pressure plasma polymerization method (see Japanese Patent Laid-Open No. 2004-68143), a plasma CVD (Chemical Vapor Deposition) method, a laser CVD method, a thermal CVD method or a coating method. Meanwhile, in the present embodiment, in particular, the use of the atmospheric pressure plasma polymerization method is preferable.

[Anode]

The anode 11 (first electrode) is an electrode film that supplies (injects) the light-emitting layer with holes, and is formed of an electrode material having a large work function (4 eV or more) such as metal, alloy, a conductive compound or a mixture thereof.

Specifically, in the organic EL element 1, when light is to be extracted from the anode 11 side, the anode 11 can be formed of an electrode material having optical transparency, including metal such as Au, or a metal compound such as CuI, ITO (Indium Tin Oxide), $SnO_2$ or ZnO. Furthermore, in this case, the anode 11 can also be formed of an amorphous transparent electrode material such as IDIXO (registered trade mark: $In_2O_3$—ZnO).

Meanwhile, in the organic EL element 1, when light is to be extracted from the anode 11 side, the light transmittance of the anode 11 is preferably larger than about 10%. Furthermore, the sheet resistance (surface resistance) of the anode 11 has preferably a value of several hundred Ω/sq or less. Moreover, the thickness of the anode 11 varies depending on the forming material, but is set, generally, to be a value in the range of about 10 to 1000 nm, preferably about 10 to 200 nm.

On the other hand, in the organic EL element 1, when light is not to be extracted from the anode 11 side (light is to be extracted only from the cathode 13 side), the anode 11 can also be formed of an electrode material having high reflectivity, such as, for example, metal, amorphous alloy or microcrystalline alloy.

The anode 11 of the above-described configuration can be formed by a technique such as evaporation or sputtering. Furthermore, at this time, the anode 11 may be formed into an intended shape pattern by using a photolithographic technology. Meanwhile, in the anode 11, when the accuracy for the shape pattern is not required (the case where the accuracy is about 100 μm or more), the anode 11 of an intended pattern may be formed using a mask into which the intended shape pattern has been formed, when forming the anode 11, for example, by a technique such as evaporation or sputtering.

[Organic Compound Layer]

The organic compound layer 12 includes, as described above, various organic layers such as the light-emitting layer, the injection layer, the blocking layer and the transport layer of carriers (holes and electrons), although not shown in FIG. 1. Hereinafter, the configuration of the respective organic layers will be explained.

(1) Hole Injection Layer

In the organic EL element 1 in the present embodiment, the hole injection layer (anode buffer layer) may be provided between the anode 11 and the light-emitting layer, or between the anode 11 and the hole transport layer to be mentioned later. Meanwhile, the hole injection layer is provided between the anode 11, and the light-emitting layer or hole transport layer, in order to achieve lowering of the drive voltage or improvement of emission luminance.

Here, detailed explanation of the configuration of the hole injection layer is omitted, but the configuration of the hole injection layer is described in detail, for example, in "Organic EL Element and Industrial Forefront Thereof (published by NTS INC., Nov. 30, 1998)," second edition, chapter 2, "Electrode Material" (pages 123 to 166). In addition, it is possible to use compounds described in Japanese Patent Laid-Open No. 2000-160328, as a material for forming the hole injection layer (anode buffer layer). Furthermore, as explained in various Examples to be mentioned later, a compound containing PEDOT (poly(3,4-ethylenedioxythiophene): structural formula (1) mentioned later) or the like may be used as a material for forming the hole injection layer (anode buffer layer).

(2) Hole Transport Layer

The hole transport layer is a layer that transports (injects) holes supplied from the anode 11 to the light-emitting layer. In addition, the hole transport layer functions as a barrier that inhibits the inflow of electrons from the cathode 13 side. Therefore, the phrase of the "hole transport layer" is sometimes used in a broad sense including the hole injection layer and/or an electron blocking layer.

Any of organic materials and inorganic materials can be used as the hole transport material, as long as it is a material capable of expressing the function of transporting (injecting) holes and the function of inhibiting the inflow of an electron as referred to above. Specifically, examples of the compounds usable as the hole transport material include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, conductive high molecular oligomers (in particular, thiophene oligomer) and the like.

Furthermore, examples of the compounds usable as the hole transport material include the porphyrin compound, aromatic tertiary amine compounds (styrylamine compounds) and the like. In particular, in the present embodiment, the use of an aromatic tertiary amine compound (for example, a compound having a structural formula (2) HT-1 used in various Examples mentioned later) as the hole transport material is preferable.

Examples of the compounds usable as the aromatic tertiary amine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-di-methylamino-2-methylphenyl)phenylmethane, bis(4-di-p-tolylaminophenyl)phenylmethane, N,N'-diphenyl-N,N'-di-(4-methoxyphenyl)-4,4'-diaminobiphenyl, N,N,N',N'-tetraphenyl-4,4'-diaminodiphenyl ether, 4,4'-bis(diphenylamino)quarterphenyl, N,N,N-tri(p-tolyl)amine and the like. Furthermore, examples of the styrylamine compounds usable as the aromatic tertiary amine compound include 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbenzene and the like. Moreover, as the aromatic tertiary amine compound, there may be used compounds such as compounds having two condensed aromatic rings in a molecule as described in U.S. Pat. No. 5,061,569, for example, 4,4'-bis[N-(1-naphthyl)-N-phenylamino]biphenyl (NPD), and 4,4',4"-tris[N-(3-methylphenyl)-N-phenylamino]triphenylamine (MTDATA) in which three triphenylamine units are linked in a starburst type as described in Japanese Patent Laid-Open No. 04-308688.

Furthermore, it is also possible to use, as the hole transport material, for example, a polymer material in which each of various hole transport materials mentioned above is introduced in the polymer chain, or a polymer material in which each of various hole transport materials mentioned above is used as the main chain of the polymer. Meanwhile, it is also possible to use inorganic compounds such as p-type Si or p-type SiC, as the hole transport material and a material for forming the hole injection layer.

Moreover, as the hole transport material, there may be used, for example, a material referred to as a so-called p-type hole transport material, as described in Japanese Patent Laid-Open No. 11-251067 or literature by J. Huang et. al. (Applied Physics Letters 80 (2002), p 139). Meanwhile, when such material is used as the hole transport material, an emission element having a higher efficiency can be obtained.

In addition, in the present embodiment, a hole transport layer having high p properties (being rich in holes) may be formed by doping impurities into the hole transport layer. Examples thereof are described, for example, in literatures such as Japanese Patent Laid-Open Nos. 04-297076, 2000-196140, 2001-102175, J. Appl. Phys., 95, 5773 (2004) and the like. When the hole transport layer that is rich in holes is used, the organic EL element 1 with a lower electric power consumption can be produced.

The hole transport layer can be formed by a technique such as a spin coat method or an evaporation method. The thickness of the hole transport layer is suitably set corresponding to conditions of a hole transport material or the like to be used, and is set, usually, to be a value in the range of about 5 nm to 5 μm, preferably to be a value in the range of about 5 to 200 nm. Meanwhile, only one layer of the hole transport layer may be provided, or a plurality of the hole transport layers may be provided. When the hole transport layer is to have a one-layer structure, it is configured such that one kind or two or more kinds of materials among the above-mentioned hole transport materials are contained in the hole transport layer.

(3) Light-Emitting Layer

The light-emitting layer is a layer in which a hole injected directly from the anode 11 or via the hole transport layer or the like from the anode 11, and an electron injected directly from the cathode 13 or via the electron transport layer or the like from the cathode 13 recombine and light is emitted. Meanwhile, the part in which the light is emitted may be inside the light-emitting layer, or may be at the interface between the light-emitting layer and a layer adjacent to it.

In addition, the light-emitting layer may be provided in one layer alone, or may be provided in a plurality of layers. Meanwhile, when the light-emitting layers are provided in a plural number, there may be employed a configuration in which a plurality of light-emitting layers different in light-emitting colors from each other is stacked. In addition, when the light-emitting layers are provided in a plural number, a non-emission-type intermediate layer may be provided between adjacent light-emitting layers. In this case, the intermediate layer can be formed of the same material as that of a host compound to be mentioned later in the light-emitting layer.

In the present embodiment, the light-emitting layer is formed of an organic light-emitting material containing a host compound (light-emitting host) and a light-emitting material (light-emitting dopant). In the light-emitting layer having the configuration, arbitrary emission color can be obtained by adjusting suitably the emission wavelength of the light-emitting material, kind of the light-emitting material to be contained or the like.

In addition, the light-emitting layer can be formed using a technique such as a spin coat method or an evaporation method. Meanwhile, the thickness of the light-emitting layer may be set arbitrarily, but for example, from the viewpoint of homogeneity of the constituent film, prevention of the application of an unnecessary high voltage at the time of light emission, the improvement of the stability of emission color relative to a driving current, or the like, the thickness of the light-emitting layer is preferably set, for example, to be a value in the range of about 2 to 200 nm, in particular, more preferably to be a value in the range of about 5 nm to 100 nm.

Here, the configuration of the host compound and the light-emitting material contained in the light-emitting layer will be explained specifically.

(1) Host Compound

A compound in which phosphorescence quantum yield of phosphorescence emission at room temperature (25° C.) is less than about 0.1 is preferably used as the host compound contained in the light-emitting layer. In particular, a compound in which phosphorescence quantum yield is less than about 0.01 is preferably used as the host compound. In addition, the volume ratio of the host compound in the light-emitting layer is preferably set to be about 50% or more among various compounds contained in the light-emitting layer.

A known host compound can be used as the host compound. At this time, a host compound of one kind may be used, or a plurality of kinds of host compounds may be used together. The use of a plurality of kinds of host compounds makes it possible to adjust the mobility (amount of movement) of charges (holes and/or electrons), and to improve the emission efficiency of the organic EL element 1.

Examples of the compounds usable as the host compound having the above-mentioned characteristics include known low-molecular compounds, high-molecular compounds having a repeating unit, low-molecular compounds having a polymerizable group such as a vinyl group or an epoxy group (vapor deposition polymerizable light-emitting host) and the like. In addition, a compound having a hole transport function, an electron transport function, a function of preventing increase in wavelength of the emission and high Tg (glass transition temperature) is preferably used as the host compound. Meanwhile, the "glass transition temperature (Tg)" referred to here is a value obtained by a technique in accordance with JIS-K7121 using a DSC (Differential Scanning calorimetry) method.

Specifically, it is possible to use, as the host compound, compounds described in literatures such as Japanese Patent Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 or 2002-308837.

Meanwhile, in the present embodiment, the host compound is preferably a carbazole derivative, and, in particular, is a carbazole derivative and a dibenzofuran compound (for example, a host compound having a structural formula (3) H-A used in various Examples to be described later).

(2) Light-Emitting Material

It is possible to use, as the light-emitting material (light-emitting dopant), for example, a phosphorescent light-emitting material (phosphorescent compound, phosphorescence light-emitting compound), fluorescent light-emitting material or the like. Meanwhile, from the viewpoint of improving the light-emitting efficiency, the use of the phosphorescent light-emitting material as the light-emitting material is preferable.

The phosphorescent light-emitting material is a compound that gives emission from an excited triplet. Specifically, the phosphorescent light-emitting material is a compound that emits phosphorescent light at room temperature (25° C.), and a compound that gives a phosphorescence quantum yield value of about 0.01 or more at 25° C. Meanwhile, in the present embodiment, the use of a phosphorescent light-emitting material that gives a phosphorescence quantum yield value of about 0.1 or more is preferable. Furthermore, the phosphorescence quantum yield can be measured by the technique described in "Fourth Edition Course of Experimental Chemistry 7, Spectroscopy II" (Maruzen, 1992), Page 398. The phosphorescence quantum yield in a solution can be measured using various solvents, and in the present embodiment, the phosphorescent light-emitting material may be a phosphorescent light-emitting material that gives phosphorescence quantum yield of about 0.01 or more in an arbitrary solvent.

Moreover, in the light-emitting layer, one kind of light-emitting material may be contained, or a plurality of kinds of light-emitting materials having different emission maximum wavelengths each other may be contained. The use of a plurality of kinds of light-emitting materials makes it possible to mix a plurality of kinds of light different in emission wavelengths from each other, and to thereby obtain light having arbitrary emission color. For example, white light can be obtained by allowing a light-emitting layer to contain a blue dopant, a green dopant and a red dopant (three kinds of light-emitting materials).

The process (principle) of emission (phosphorescent light emission) in the light-emitting layer containing the above-mentioned host compound and phosphorescent light-emitting material includes the following two kinds of processes.

A first emission process is an emission process of an energy transfer type. In the emission process of this type, first, carriers are recombined on the host compound in the light-emitting layer through which carriers (holes and electrons) are transported, and thus the excited state of the host compound is generated. Then, the energy generated at this time is transferred from the host compound to the phosphorescent light-emitting material (the energy level of the excited state is transferred from the excitation level of the host compound to the excitation level of the phosphorescent light-emitting material (excited triplet)), and as a result, light emission is generated from the phosphorescent light-emitting material.

A second emission process is an emission process of a carrier-trap type. In the emission process of this type, the phosphorescent light-emitting material traps carriers (holes and electrons) in the light-emitting layer. As the result, the recombination of carriers occurs on the phosphorescent light-emitting material, and light emission is generated from the phosphorescent light-emitting material. In both emission processes mentioned above, the energy level in the excited state of the phosphorescent light-emitting material is required to be set to be lower than the energy level in the excited state of the host compound.

It is possible to suitably select and use, as the phosphorescent light-emitting material that causes the emission process mentioned above to be generated, an intended phosphorescent light-emitting material from among known various phosphorescent light-emitting materials (phosphorescent compounds) used in conventional organic EL elements. It is possible to use, as the phosphorescent light-emitting material, for example, a complex-based compound containing a metal element in the group 8 to the group 10 of the periodic table of elements. Among such complex-based compounds, the use of any of iridium compounds, osmium compounds, platinum compounds (platinum complex-based compounds), and rare-earth complexes is preferable as the phosphorescent light-emitting material. In the present embodiment, in particular, the use of an iridium compound (for example, the phosphorescent light-emitting dopant having structural formulae (4) to (6) used in various Examples to be mentioned later) as the phosphorescent light-emitting material is preferable.

Furthermore, it is possible to use, as the fluorescent light-emitting material (fluorescent light-emitting body, fluorescent dopant), for example, a coumarin-based dye, a pyran-based dye, a cyanine-based dye, a croconium-based dye, a squarylium-based dye, an oxobenzanthracene-based dye, a fluorescein-based dye, a rhodamine-based dye, a pyrylium-based dye, a perylene-based dye, a stilbene-based dye, a polythiophene-based dye, a rare earth complex-based fluorescent body and the like.

Meanwhile, in the description, the color of light emitted from the organic EL element 1 is defined from the color obtained by measuring the light emitted from the organic EL element 1 with a spectral radiance meter (CS-1000, manufactured by Konica Minolta Sensing) and by applying the measurement result to the CIE (Commission Internationale de l'Eclairage) chromaticity coordinate (for example, see "New Edition Handbook of Color Science" (edited by Color Science Association of Japan, University of Tokyo Press, 1985) page 108, FIG. 4.16). Specifically, "white color" as referred to herein means the color of chromaticity that is within the region of $X=0.33\pm0.07$, $Y=0.33\pm0.07$ at 1000 cd/m$^2$ in accordance with the CIE1931 color specification system, when front luminance at 2-degree viewing angle is measured by the above-described technique.

Furthermore, in the present embodiment, a technique of allowing the host compound to contain a plurality of light-emitting materials having different emission wavelengths from each other is used as a technique for obtaining white light emission, but the present invention is not limited to this. For example, white light emission may be obtained by stacking a blue light-emitting layer, a green light-emitting layer and a red light-emitting layer to thereby constitute a light-emitting layer and by mixing each light emitted from the light-emitting layer of each color.

(4) Electron Transport Layer

The electron transport layer is a layer that transports (injects) electrons supplied from the cathode 13 into the light-emitting layer. Furthermore, the electron transport layer also acts as a barrier that inhibits the inflow of a hole from the anode 11 side. Therefore, the phrase of "electron transport layer" is sometimes used, in a broad sense, as the meaning also including the electron injection layer and/or the hole blocking layer.

An arbitrary material can be used as an electron transport material (serving as a hole-inhibiting material) used for the electron transport layer adjacent to the cathode 13 side of the light-emitting layer (which corresponds to the electron transport layer when the electron transport layer has a one-layer structure, or which corresponds to an electron transport layer positioned on the side the most close to the light-emitting layer when the electron transport layer is provided in a plural number), as long as it is a material having a function of transferring (transporting) electrons injected from the cathode 13, to the light-emitting layer. For example, as the electron transport material, it is possible to arbitrarily select and use a suitable compound from among various known compounds to be used in conventional organic EL elements.

More specifically, it is possible to use, as an electron transport material, for example, a metal complex of fluorene derivatives, carbazole derivatives, azacarbazole derivatives, oxadiazole derivatives, triazole derivatives, silole derivatives, pyridine derivatives, pyrimidine derivatives or 8-quinolinol derivatives. It is also possible to use, as another electron transport material, for example, metal phthalocyanine or metal-free phthalocyanine, or a compound obtained by substituting an end group thereof by an alkyl group, a sulfonic acid group or the like. In addition, in the present embodiment, it is also possible to use, for example, a dibenzofuran derivative having a structural formula (7) ET-1 used in various Examples to be mentioned later, as an electron transport material.

Furthermore, in the present embodiment, an electron transport layer having high n properties (being rich in electrons) may be formed by doping impurities into the electron transport layer as a guest material. Specific examples of electron transport layers having the configuration are described, for example, in literatures such as Japanese Patent Laid-Open Nos. 04-297076, 10-270172, 2000-196140, 2001-102175 or J. Appl. Phys., 95, 5773 (2004). Specifically, it is possible to use an alkali metal salt of an organic substance as a guest material (doping material).

When using an alkali metal salt of an organic substance as a doping material, the kind of the organic substance is arbitrary, and examples of the compounds usable as the organic substance include formates, acetates, propionates, butyrates, valerates, caproates, enanthates, caprylates, oxalates, malonates, succinates, benzoates, phthalates, isophthalates, terephthalates, salicylates, pyruvates, lactates, malates, adipates, mesylates, tosylates, benzenesulfonates and the like. Among these, in particular, the use of a formate, an acetate, a propionate, a butyrate, a valerate, a caproate, an enanthate, a caprylate, an oxalate, a malonates, a succinate or a benzoate as the organic substance is preferable. The more preferable organic substance is an aliphatic carboxylic acid such as a formate, an acetate, a propionate or a butyrate, and when using the aliphatic carboxylic acid, preferably the acid has a carbon number of 4 or less. Meanwhile, the most preferable compound as the organic substance is an acetate.

In addition, the kind of alkali metal constituting the alkali metal salt of the organic substance is arbitrary, and it is possible to use, for example, Li, Na, K or Cs. Among these alkali metals, a preferable alkali metal is K or Cs, and a more preferable alkali metal is Cs.

Therefore, the alkali metal salt of the organic substance usable as the doping material of the electron transport layer is a compound obtained by combining the above-described organic substance and the above-described alkali metal. Specifically, it is possible to use, as the doping material, for example, Li formate, K formate, Na formate, Cs formate, Li acetate, K acetate, Na acetate, Cs acetate, Li propionate, Na propionate, K propionate, Cs propionate, Li oxalate, Na oxalate, K oxalate, Cs oxalate, Li malonate, Na malonate, K malonate, Cs malonate, Li succinate, Na succinate, K succinate, Cs succinate, Li benzoate, Na benzoate, K benzoate or Cs benzoate. Among these, Li acetate, K acetate, Na acetate or Cs acetate is a preferable doping material, and the most preferable doping material is Cs acetate. Meanwhile, the preferable content of these doping materials has a value in the range of about 1.5 to 35% by mass relative to the electron transport layer to which the doping material is added, the more preferable content has a value in the range of about 3 to 25% by mass, and the most preferable content has a value in the range of about 5 to 15% by mass.

The electron transport layer can be formed by a technique such as a spin coat method or an evaporation method. The thickness of the electron transport layer is set arbitrarily according to conditions such as an electron transport material or the like to be used, and usually, is set to be a value in the range of about 5 nm to 5 μm, preferably in the range of about 5 to 200 nm. Meanwhile, only one layer of the electron transport layer may be provided or a plurality of layers may be provided. When the electron transport layer of a one-layer structure is selected, it is configured such that one kind or two or more kinds of materials among the above-mentioned electron transport materials are contained in the electron transport layer.

(5) Electron Injection Layer

In the organic EL element 1 in the present embodiment, the electron injection layer (electron buffer layer) may be provided between the cathode 13 and the light-emitting layer, or between the cathode 13 and the electron transport layer. The electron injection layer is provided between the cathode and the organic layer (light-emitting layer or electron transport layer) in order to achieve the lowering of the drive voltage or the improvement of the emission luminance of the organic EL element 1, in the same way as the hole injection layer.

Here, although detailed explanation of the configuration of the electron injection layer is omitted, the configuration of the electron injection layer is described in detail, for example, in "Organic EL Element and Industrial Forefront Thereof (published by NTS INC., Nov. 30, 1998)," second edition, chapter 2, "Electrode Material" (pages 123 to 166).

[Cathode]

The cathode 13 is an electrode film that supplies (injects) electrons into the light-emitting layer, and usually, is formed of an electrode material having a small work function (4 eV or less) such as metal (electron injection metal), alloy, a conductive compound or a mixture thereof.

Specifically, when light is not extracted from the cathode 13 side in the organic EL element 1, the cathode 13 can be formed of a nontransparent electrode material such as aluminum, sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture or rare-earth metal.

On the other hand, in the organic EL element 1, when light is extracted from the cathode 13 side, the cathode 13 can be formed of an electrode material having optical transparency. In the present embodiment, the use of IDIXO (registered trade mark: $In_2O_3$—ZnO) which is an amorphous transparent electrode material, as the material for forming the cathode 13 is preferable.

The cathode 13 can be formed by a technique such as evaporation or sputtering.

[Inorganic Film]

The inorganic film 14 (gas barrier layer) is provided for preventing permeation of water vapor into the organic compound layer 12 including a light-emitting layer (for moisture prevention). Meanwhile, the inorganic film 14 is preferably constituted of a transparent inorganic film.

Any material can be used as the material for forming the inorganic film 14, as long as it is an inorganic material capable of suppressing permeation of, for example, moisture, oxygen or the like, which cause the deterioration of the organic EL element 1, into the organic EL element 1. In addition, the inorganic film 14 is preferably constituted of a covering film that gives a value of a water vapor transmission rate of about 0.01 g/[$m^2 \cdot day \cdot atm$] or less.

It is possible to use, as the material for forming the inorganic film 14 having the characteristics as mentioned above, an inorganic material such as silicon oxide, silicon dioxide, silicon nitride or silicon nitride oxide. In the present embodiment, in particular, the inorganic film 14 is preferably constituted of a single film of silicon nitride or silicon nitride oxide.

Meanwhile, a film including an organic material may be stacked on the inorganic film 14 in order to improve brittleness of the inorganic film 14. In this case, it is possible to use, as the organic material, a sealing agent such as a photocurable sealing agent, a heat-curable sealing agent, a moisture-curable sealing agent such as 2-cyanoacrylic acid ester, a sealing agent of a heat and chemically curable type (two-pack mixing type) such as an epoxy-based agent, or an epoxy resin sealing agent of an ultraviolet-curable type of a cation-curable type.

Any technique can be used as techniques for forming the inorganic film 14, and examples of usable techniques include a vacuum evaporation method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, a coating method and the like.

Meanwhile, when the thickness of the inorganic film 14 is too small, a defect or the like is generated in the inorganic film 14, and an adhesive enters the cathode 13 via the defect. In this case, oxidation or the like of the cathode 13 occurs by the curing reaction of the adhesive layer 3 to generate an influence such as change in quality. Furthermore, when the thickness of the cathode 13 is small, an adhesive enters the organic compound layer 12 via the defect or the like in the inorganic film 14 and the cathode 13, which serves as a factor of the increase in a dark spot.

On the other hand, when the thickness of the inorganic film 14 is too large, for example, the productivity and flexibility of the organic EL element 1 are lowered. Furthermore, when the thickness of the inorganic film 14 is too large, the light-emitting performance sometimes deteriorates by the influence of damage to the organic compound layer 12 or the like generated in the formation of the inorganic film 14.

Therefore, in the present embodiment, the thickness of the inorganic film 14 is suitably set in consideration of these points. Specifically, it is preferable to set the thickness of the inorganic film 14 to be a value of about less than 1 μm, and in particular, it is preferable to set the thickness to be a value in the range of about 100 nm to 250 nm.

[Inorganic Insulation Film]

The inorganic insulation film 15 is provided for preventing an electrical short circuit between the anode 11 and the cathode 13. The inorganic insulation film 15 is formed of an insulation film such as, for example, a $SiO_2$ film.

When the inorganic insulation film 15 is constituted of a $SiO_2$ film, the inorganic insulation film 15 can be formed by, for example, a sputtering method on the anode 11. Furthermore, the inorganic insulation film 15 can also be formed by forming a Si film on the anode 11, and after that, thermally oxidizing the Si film. Moreover, the inorganic insulation film 15 can also formed by a CVD method under reduced pressure or ordinary pressure using gas such as silane or tetraethoxysilane as a raw material gas.

[Adhesive Layer]

Examples of the adhesives usable in the adhesive layer 3 (sealing resin layer) include photo-curable or heat-curable adhesives having a reactive vinyl group of an acrylic acid-based oligomer or a methacrylic acid-based oligomer, moisture-curable adhesive agents such as 2-cyanoacrylic acid ester, and the like. Furthermore, a heat-curable or chemically curable (two-pack mixing type) adhesive such as an epoxy-based adhesive may be used as an adhesive. Moreover, polyamide, polyester or polyolefin of a hot melt type may be used as an adhesive. In addition, an ultraviolet-curable epoxy resin adhesive of a cation-curable type may be used as an adhesive.

Meanwhile, in the present embodiment, the adhesive layer 3 is preferably formed of a heat-curable adhesive from the viewpoint of simplicity of a manufacturing process. In addition, as to the form of the adhesive layer 3, the use of a heat-curable adhesive processed into a sheet shape is preferable. When a heat-curable adhesive of a sheet-shaped type is to be used, a heat-curable adhesive (sealing member) formed into a sheet shape that exhibits a non-fluid property at ordinary temperature (around 25° C.) and expresses a fluid property when a temperature reaches a value in the range of 50 to 120° C. by heating, is used. Meanwhile, in the present embodiment, since the organic compound layer 12 is sealed with three layers (cathode 13, inorganic film 14 and adhesive layer 3), a good sealing performance can be obtained even when a sheet-shaped (small thickness) heat-curable adhesive is used.

Any adhesive can be used as the heat-curable adhesive. In the present embodiment, from the viewpoint of improving adhesiveness, a favorable heat-curable adhesive is selected suitably in consideration of the compatibility of adhesiveness to the sealing base material 4, the element substrate 10 or the like, adjacent to the adhesive layer 3. For example, there can be used a resin containing a compound having an ethylenic double bond at an end or on a side chain of a molecule and a thermal polymerization initiator, as main components. More specifically, a heat-curable adhesive including an epoxy-based resin, an acrylic resin or the like can be used. In addition, a fusible type heat-curable adhesive may be used in accordance with a sticking apparatus and a curing treatment apparatus used in the manufacturing process of the organic EL element 1.

[Sealing Base Material]

The sealing base material 4 is constituted of a film-like (plate-like) member, and is arranged facing the element substrate 10. The sealing base material 4 can be formed of, for example, a transparent material such as glass or plastic. In particular, the sealing base material 4 is preferably constituted of a glass substrate, a quartz substrate or a flexible sealing member. Meanwhile, it is possible to use, as the flexible sealing member, for example, a multilayer film member obtained by stacking a resin layer and a barrier layer (film including inorganic substance), a member such as a thin film glass having flexibility, or the like.

When the sealing base material 4 is constituted of a flexible sealing member, it is preferable to use a flexible sealing member of a multilayer film configuration in which a resin layer and a barrier layer are stacked. In addition, the thickness of the flexible sealing member is preferably set to be a value, for example, in the range of about 10 to 300 μm, in consideration of handleability in manufacturing and characteristics such as tensile strength and stress cracking resistance of the barrier layer. Meanwhile, the "thickness" referred to herein is an average thickness of the flexible sealing member, and is an average value of thicknesses, for example, measured in about 10 portions along the longitudinal direction and the width direction, respectively, of the flexible sealing member, by using a micrometer.

When the sealing base material 4 is constituted of a flexible sealing member, the moisture amount of the flexible sealing member in the sealing is preferably set to be a value of about 1.0% or less, in consideration of, for example, the suppression of crystallization of the organic compound layer generated due to the moisture carried in by the flexible sealing member, the suppression of the dark spot generated due to the peeling or the like of the cathode 13, a longer life time of the organic EL element 1, and the like. Meanwhile, the "moisture amount" referred to herein is a value measured by a technique in accordance with ASTM (American Society for Testing and Materials)-D570.

A resin base material constituting the flexible sealing member can be formed of a thermoplastic resin used for a general packing film such as, for example, ethylene-tetrafluoroethyl copolymer (ETFE), high-density polyethylene (HDPE), oriented polypropylene (OPP), polystyrene (PS), polymethyl methacrylate (PMMA), oriented nylon (ONy), polyethylene terephthalate (PET), polyethylene naphthalate (PEN), polycarbonate (PC), polyimide, polyether styrene (PES) or the like. Meanwhile, it is also possible to use, as the thermoplastic resin film, a multilayer film produced by co-extruding films of different kinds, a multilayer film produced by sticking a plurality of films while mutually changing the extension angles, or the like, as necessary. In addition, when such multilayer film is to be produced, films are preferably combined in consideration of physical properties such as density and molecular weight distribution of each of films to be used in order to obtain physical properties required for the flexible sealing member.

Furthermore, the water vapor permeability of the barrier layer constituting the flexible sealing member has preferably a value of about 0.01 g/[$m^2$·day·atm] or less in consideration of, for example, the suppression of crystallization of the organic compound layer 12, the suppression of the dark spot generated due to the peeling or the like of the cathode 13, longer life time of the organic EL element 1, and the like. Moreover, the oxygen permeability of the barrier layer has preferably a value of about 0.01 $cm^3$/[$m^2$·day·atm] or less in consideration of, for example, the suppression of crystallization of the organic compound layer, the suppression of the dark spot generated due to the peeling or the like of the cathode 13, longer life time of the organic EL element 1, and the like.

Any material can be used as the material for forming the barrier layer, as long as it is a material having the above-mentioned water vapor permeability and oxygen permeability. For example, the barrier layer can be constituted of a covering film including an inorganic material such as silicon oxide, silicon dioxide or silicon nitride. Furthermore, in order to improve brittleness of the barrier film, the barrier film is more preferably constituted of a hybrid coating film (multi-layer film) in which a coating film including the above-described inorganic material and a coating film including an organic material are stacked. Meanwhile, in this case, the coating film including the inorganic material and the coating film including an organic material may be stacked in an arbitrary order, and preferably both are stacked alternately in a plural number.

In addition, any technique can be used as the technique for forming the barrier layer, as long as it is a technique capable of forming the barrier layer on a resin layer. Examples of the usable techniques include a vacuum evaporation method, a sputtering method, a reactive sputtering method, a molecular beam epitaxial method, a cluster ion beam method, an ion plating method, a plasma polymerization method, an atmospheric pressure plasma polymerization method (see Japanese Patent Laid-Open No. 2004-68143), a plasma CVD method, a laser CVD method, a thermal CVD method, a coating method, and the like. Meanwhile, among these techniques for forming the barrier layer, in particular, the formation of the barrier layer by using an atmospheric pressure plasma polymerization method is preferable.

[Technique for Manufacturing Organic EL Element]

Here, the technique for manufacturing the organic EL element 1 of the present embodiment will be explained briefly.

First, in the present embodiment, the anode 11 is formed on the element substrate 10. Next, an inorganic insulation film 15 is formed on a prescribed area within the non light-emitting area of the anode 11. After that, the organic compound layer 12 including a light-emitting layer is formed on the anode 11 and on a part of the region of the inorganic insulation film 15.

Next, the cathode 13 is formed on the organic compound layer 12 so as to cover the organic compound layer 12, and furthermore the inorganic film 14 is formed on the cathode 13 so as to cover the cathode 13.

In addition, a sealing member in which the adhesive layer 3 is provided on the sealing base material 4, is prepared. Next, the element substrate 10 and the sealing base material 4 is stuck so that the inorganic film 14 of the element substrate 10 and the adhesive layer 3 provided on the sealing base material 4 face each other. At this time, the element substrate 10 and the sealing base material 4 are stuck, while pressing a sticking member at a prescribed pressure with heating at a prescribed temperature.

In the present embodiment, the organic EL element 1 is produced in this way. Meanwhile, the sticking treatment is preferably carried out under an atmosphere of reduced pressure. Consequently, an air bubble can be prevented from remaining inside the organic EL element 1 when the organic EL element main body 2 (element substrate 10) and the sealing base material 4 are stuck.

<2. Configuration of Planar Light-Emitting Unit>

Next, the planar light-emitting unit produced by arranging (tiling) a plurality of the above-mentioned organic EL elements 1 will be explained.

[Configuration of Planar Light-Emitting Unit]

Figure 2:
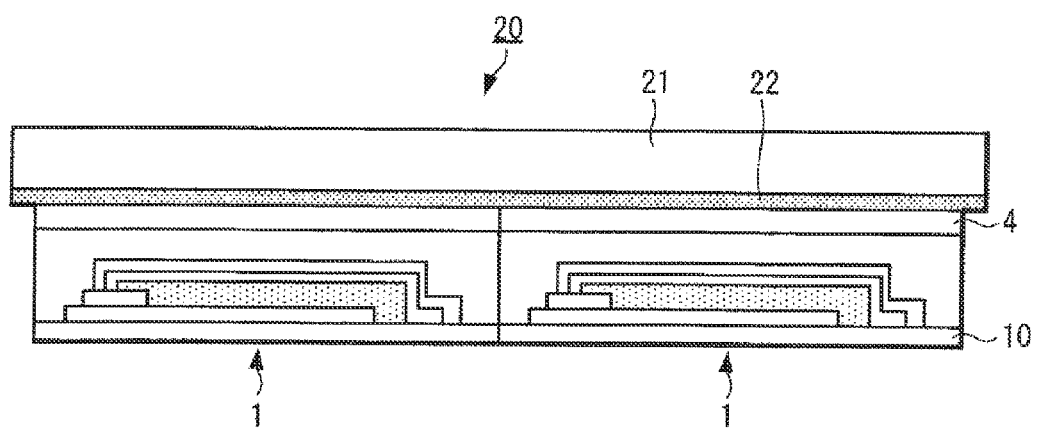
FIG. 2 is a schematic configuration sectional view of the planar light-emitting unit according to an embodiment of the present invention.

In FIG. 2, a schematic configuration sectional view of the planar light-emitting unit according to one embodiment of the present invention is shown. Meanwhile, in FIG. 2, a configuration example in which two organic EL elements 1 are arranged is shown in order to simplify the explanation, but the present invention is not limited to this. The number and arrangement form of the organic EL element 1 constituting the planar light-emitting unit are set suitably, for example, depending on the intended use or the like.

The planar light-emitting unit 20 includes two organic EL elements 1, a support substrate 21 (support member), and an adhesion member 22 for fixing each of the organic EL elements 1 on the support substrate 21.

In the planar light-emitting unit 20, the surface of each of the organic EL elements 1 on the sealing base material 4 side is to be fixed on the larger-sized support substrate 21 with the adhesion member 22. Meanwhile, at this time, in the example shown in FIG. 2, two organic EL elements 1 are arranged on the support substrate 21 so that side surfaces of two organic EL elements 1 facing each other make contact with each other. Furthermore, at this time, two organic EL elements 1 are arranged on the support substrate 21 so that the light extraction surfaces (the surface on the element substrate 10 side) of the arranged two organic EL elements 1 become flush with each other. Hereinafter, configurations of respective parts of the planar light-emitting unit 20 will be explained more specifically.

[Support Substrate]

It is possible to use any plate-like member as the support substrate 21, as long as the member is a plate-like member that can maintain the state when two organic EL elements 1 are mounted via the adhesion member 22.

Meanwhile, when the planar light-emitting unit 20 has a configuration of being bent flexibly, the support substrate 21 is constituted of a flexible substrate having bending properties. For example, it is possible to use a resin film or a glass substrate (thin-film glass) in which the value of the substrate thickness is in the range of about 0.01 mm to 0.50 mm, or the like, as the flexible substrate.

[Adhesion Member]

In the present embodiment, among adhesion members used being referred to as a gluing agent or an adhesive agent, or a gluing material or an adhesive material in various industrial fields, there is used a curable-type adhesion member 22 which forms a high-molecular-weight body or a cross-linked structure through various chemical reactions after being coated on the support substrate 21 or sealing base material 4 to thereby stick the support substrate 21 and the sealing base material 4 together. That is, the adhesion member 22 is formed of a material, the material of adhesion parts being cured by irradiation with light such as ultraviolet rays, or by heating or pressurizing the adhesion member 22.

Examples of the adhesion members 22 having the above-mentioned physical properties include curable type adhesives such as urethane-based, epoxy-based, fluorine-containing-based, aqueous polymer-isocyanate-based and acrylic, moisture curable urethane adhesives, anaerobic adhesives such as a polyether methacrylate type, an ester-based methacrylate type and oxidized type polyether methacrylate, cyanoacrylate-based instant adhesives and acrylate-peroxide-based two-component type instantaneous adhesives, and the like.

In addition, any technique can be used as the technique for forming the adhesion member 22, and in particular, the use of a technique capable of supplying an uncured adhesive is preferable. Examples of the techniques include a gravure coater, a microgravure coater, a comma coater, a bar coater, spray coating, an inkjet method and the like. A technique suitable for an adhesive to be used is employed as a technique for curing the uncured adhesion member 22.

Meanwhile, in the example shown in FIG. 2, the configuration example in which a plurality of organic EL elements 1 is supported using the support substrate 21, has been explained, but the present invention is not limited to this. For example, when side parts of two organic EL elements 1 adjacent to each other are stuck each other with an adhesive (support member), the support substrate 21 may not be used.

<4. Various Examples and Characteristic Evaluation>

Next, the configuration of various examples of organic EL elements (organic EL panel) actually produced, and characteristic evaluation carried out for the organic EL elements in Examples will be explained.

Figure 3:
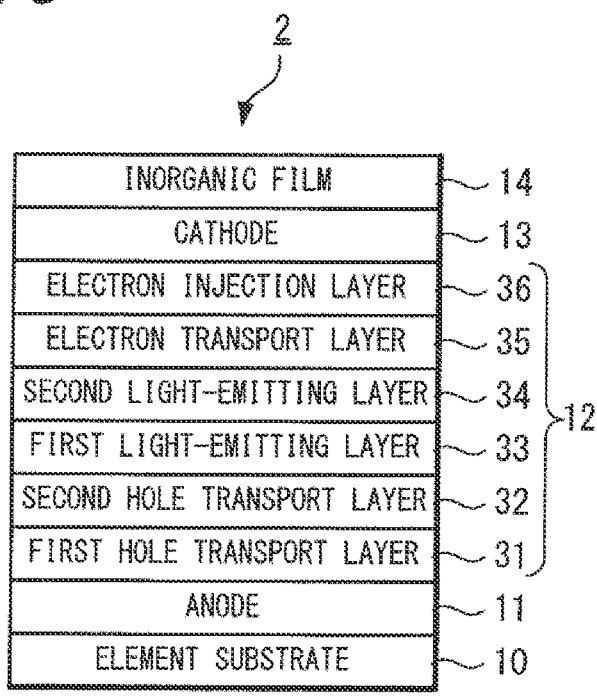
FIG. 3 is a schematic configuration sectional view of the organic EL element produced in various Examples.

In FIG. 3, a schematic configuration sectional view of the organic EL element main body of the organic EL element in various Examples described below is shown. Meanwhile, in the organic EL element main body 2 shown in FIG. 3, the same reference sign is attached to the configuration same as that shown in FIG. 1. Furthermore, in FIG. 3, the illustration of the inorganic insulation film 15 is omitted for simplification of the explanation.

In various Examples to be explained below, the organic compound layer 12 is provided with a first hole transport layer 31, a second hole transport layer 32, a first light-emitting layer 33, a second light-emitting layer 34, an electron transport layer 35 and an electron injection layer 36. In addition, in the example, the first hole transport layer 31, the second hole transport layer 32, the first light-emitting layer 33, the second light-emitting layer 34, the electron transport layer 35 and the electron injection layer 36 are stacked in this order on the anode 11.

Next, while explaining the manufacturing technique of the organic EL element in various Examples, the specific configuration (for example, material, dimension and the like) of respective portions of the organic EL element will be explained.

Example 1

First, a glass substrate (thin film glass: NH45, manufactured by NH TECHNOGLASS CORPORATION) having dimensions of 150 mm×150 mm×100 μm was prepared as the element substrate 10. Next, ITO (transparent electrode material) having thickness of 150 nm was deposited on the element substrate 10 and the anode 11 was formed. Subsequently, the anode 11 was subjected to a patterning treatment and the anode 11 of a prescribed shape was formed.

Next, a SiO₂ film having thickness of 200 nm was deposited on the anode 11 by a sputtering method. After that, the SiO₂ film was subjected to a patterning treatment and the inorganic insulation film 15 of a prescribed shape was formed on the anode 11. Specifically, as shown in FIG. 1, the inorganic insulation film 15 was formed within a prescribed area near the outer peripheral end part of the anode 11 (prescribed area in non light-emitting area of anode 11). Next, the element substrate 10, on which the anode 11 and the inorganic insulation film 15 were formed, was subjected to ultrasonic cleaning with isopropyl alcohol. Then, the element substrate 10 subjected to ultrasonic cleaning was dried with dry nitrogen gas, and furthermore, UV ozone cleaning was performed for 5 minutes on the element substrate 10 after the drying.

Next, a solution which was obtained by diluting poly(3,4-ethylenedioxythiophene)-polystyrene sulfonate (PEDOT/PSS: Baytron P Al 4083, manufactured by Bayer) with pure water to give the percentage of 70% by mass, was coated on the anode 11 and on apart of the region of the inorganic insulation film 15, by a spin coating method under conditions of 3000 rpm for 30 seconds. After that, the coated solution was dried at 200° C. for 1 hour, and thus the first hole transport layer 31 having a thickness of 30 nm was formed. Meanwhile, PEDOT contained in the first hole transport layer 31 is represented by a structural formula (1) below.

[Chem 1]

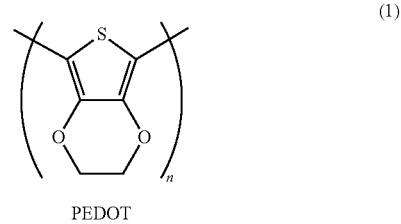

PEDOT

Next, the element substrate 10 on which layers up to the first hole transport layer 31 had been formed, was moved to an atmospheric circumstance of nitrogen gas (grade G1). Subsequently, under the nitrogen atmosphere, a solution which was obtained by dissolving a hole transport material (HT-1 compound: molecular weight 80,000) represented by the structural formula (2) below in chlorobenzene at a rate of 0.5% by mass, was coated on the first hole transport layer 31 by a spin coat method under conditions of 1500 rpm for 30 seconds. After that, the coated solution was dried for 30 minutes at 160° C., and thus the second hole transport layer 32 having a thickness of 30 nm was formed.

[Chem 2]

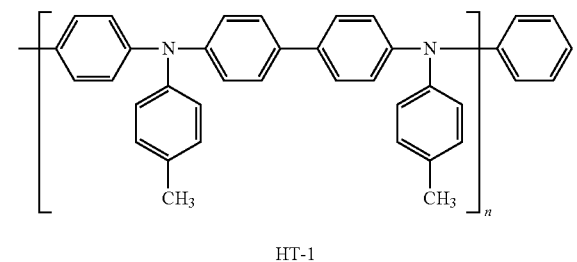

HT-1

Next, a first light-emitting layer composition (solvent: isopropyl acetate) containing the host compound, a blue dopant, a green dopant and a red dopant at a ratio described below was discharged and injected onto the second hole transport layer 32 by using an inkjet head. At this time, in the example, the first light-emitting layer composition was discharged so that the thickness of the coating solution of the first light-emitting layer composition became 5.3 μm. Then, the element substrate 10 on which the first light-emitting layer composition was coated, was dried for 10 minutes in a dry box at 120° C., and the first light-emitting layer 33 having a thickness of 40 nm was formed.

(First Light-Emitting Layer Composition)
  Host compound (H-A): 0.69 parts by mass
  Blue dopant (D-66): 0.30 parts by mass
  Green dopant (D-67): 0.005 parts by mass
  Red dopant (D-80): 0.005 parts by mass
  Isopropyl acetate: 100 parts by mass Meanwhile, the host compound (H-A), the blue dopant (D-66), the green dopant (D-67) and the red dopant (D-80) in the first light-emitting layer composition are represented by the structural formulae (3) to (6), respectively, below.

[Chem 3]

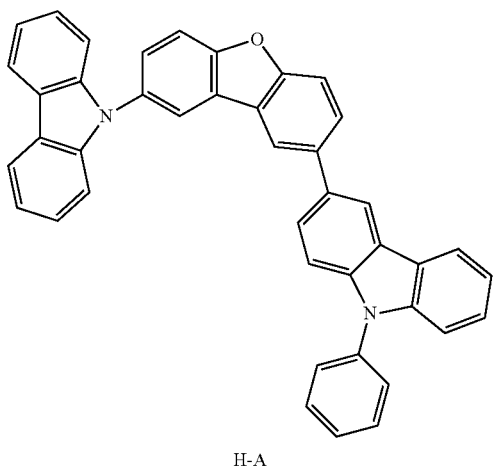

H-A

[Chem 4]

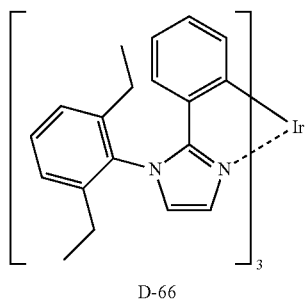

D-66

[Chem 5]

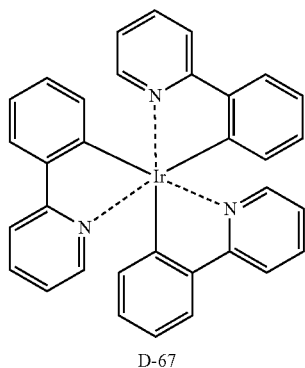

D-67

[Chem 6]

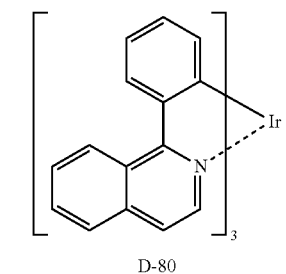

D-80

Next, a second light-emitting layer composition (solvent: isopropyl acetate) containing the host compound, the blue dopant, the green dopant and the red dopant at a ratio described below was discharged and injected onto the first light-emitting layer 33 by using an inkjet head. At this time, in the example, the second light-emitting layer composition was discharged so that the thickness of the coating solution of the second light-emitting layer composition became 5.3 μm. Then, the element substrate 10 on which the second light-emitting layer composition had been coated, was dried for 10 minutes in a dry box at 120° C., and the second light-emitting layer 34 having a thickness of 40 nm was formed.

(Second Light-Emitting Layer Composition)
  Host compound (H-A): 0.89 parts by mass
  Blue dopant (D-66): 0.10 part by mass
  Green dopant (D-67): 0.005 parts by mass
  Red dopant (D-80): 0.005 parts by mass
  Isopropyl acetate: 100 parts by mass Next, a solution which was obtained by dissolving 30 mg of an electron transport material (ET-1 compound) represented by the structural formula (7) below in 4 ml of tetrafluoropropanol (TFPO), was coated on the second light-emitting layer 34 by a spin coat method under conditions of 1500 rpm for 30 seconds. After that, the coated solution was dried for 30 minutes at 120° C., and thus the electron transport layer 35 having a thickness of 30 nm was formed.

[Chem 7]

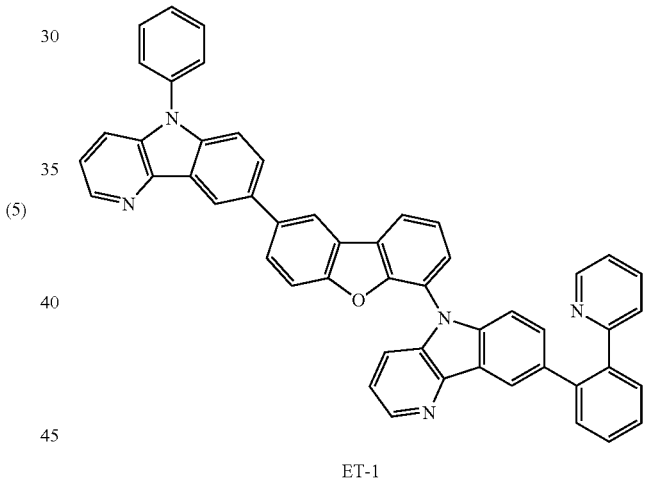

ET-1

Next, the element substrate 10 on which layers up to the electron transport layer 35 had been stacked, was mounted in a vacuum evaporation apparatus without air exposure. Furthermore, resistance heating boats made of molybdenum, with which sodium fluoride and potassium fluoride were filled, respectively, were mounted in a vacuum chamber of the vacuum evaporation apparatus. Subsequently, after reducing the pressure inside the vacuum chamber to $4\times10^{-5}$ Pa, an electric current was applied to the resistance heating boat with which sodium fluoride was filled, to thereby heat the sodium fluoride, and a thin film of sodium fluoride was formed on the electron transport layer 35 at a rate of 0.02 nm/sec. At this time, a thin film of sodium fluoride having a thickness of 1 nm was formed in the example. Next, an electric current was applied to the resistance heating boat with which sodium fluoride was filled, to thereby heat the sodium fluoride, and a thin film of potassium fluoride was formed on the thin film of sodium fluoride at a rate of 0.02 nm/sec. Meanwhile, a thin film of potassium fluoride having a thickness of 1.5 nm was formed in the example. In the example, in this way, the electron injection layer 36 was formed on the electron transport layer 35.

Next, sputtering of aluminum was performed using a sputtering apparatus to form the cathode 13 having a thickness of 300 nm on the electron injection layer 36.

Next, sputtering of silicon nitride (SiNx) was performed to form the inorganic film 14 having a thickness of 200 nm on the cathode 13. Meanwhile, sputtering conditions at this time are as follows. Silicon nitride (SiNx) was used as the target material, and the shape of the target was set to be cylindrical. In addition, the element substrate 10 on which layers up to the cathode 13 had been stacked, was disposed so that the distance between the upper end of the target and the element substrate 10 became 7 cm. Furthermore, argon gas containing oxygen in 2% by volume was used as sputtering gas, and gas pressure in the sputtering was set to be $1.33 \times 10^{-2}$ Pa. An AC power source having a frequency of 13.56 MHz was used as a sputtering power source, and, the monitoring of the deposition rate with a quartz oscillator when an applied power was 100 W gave 0.1 nm/sec.

In the example, as mentioned above, the organic EL element main body 2 was produced. Furthermore, in the example, the sealing base material 4 in which a sheet-like adhesive made of an epoxy-based resin has previously been stuck, was prepared. Meanwhile, in Example 1, the thickness of the sheet-like adhesive was set to be 20 μm, and a glass substrate (thin film glass) of 150 mm×150 mm×100 μm was used as the sealing base material 4.

Next, the organic EL element main body 2 and the sealing base material 4 were stuck so that the inorganic film 14 of the organic EL element main body 2 and the sheet-like adhesive provided on the sealing base material 4 faced each other. Then, the sticking member was heated and pressure-bonded for 3 minutes with the use of a vacuum laminator at 100° C. Next, the heated and pressure-bonded member was heated for 60 minutes at a constant temperature of 100° C. on a hot plate, and furthermore, the member after the heating was cooled at room temperature. In Example 1, in this way, the organic EL element 1 was produced. Meanwhile, in the example, the sealing width (width of seal) of the organic EL element 1 was set to be 3 mm.

Example 2

In Example 2, the cathode 13 was formed of IDIXO (registered trade mark: $In_2O_3$—ZnO, transparent electrode material), and the thickness thereof was set to be 200 nm. In the organic EL element in Example 2, configurations other than that of the cathode 13 were set to be the same as the corresponding configurations of the organic EL element in the above-mentioned Example 1. In addition, the organic EL element of the example was also produced in the same way as in the above-mentioned Example 1.

Example 3

In Example 3, cathode 13 was constituted of an Al film having thickness of 300 nm. Meanwhile, in the example, the cathode 13 was formed by an EB (Electron Beam) evaporation method. In the example, the organic EL element was produced in the same way as in the above-mentioned Example 1, except for changing the technique for forming the cathode 13. In addition, the film configuration of the organic EL element of the example was set to be the same as that of the organic EL element in the above-mentioned Example 1.

Example 4

In Example 4, the inorganic film 14 was constituted of a $SiO_2$ film having a thickness of 200 nm. In the organic EL element in Example 4, configurations other than that of the inorganic film 14 were set to be the same as the corresponding configurations of the organic EL element in the above-mentioned Example 1. In addition, the organic EL element of the example was also produced in the same way as in the above-mentioned Example 1.

Example 5

In Example 5, the inorganic film 14 was constituted of an SiNx film (silicon nitride film) having a thickness of 90 nm. In the organic EL element of the example, configurations other than that of the inorganic film 14 were set to be the same as the corresponding configurations of the organic EL element in the above-mentioned Example 1. In addition, the organic EL element of the example was also produced in the same way as in the above-mentioned Example 1.

Example 6

In Example 6, the cathode 13 was constituted of an Al film having a thickness of 1000 nm, and the inorganic film 14 was constituted of an SiNx film having a thickness of 2000 nm. In the organic EL element of the example, configurations other than that of the cathode 13 and that of the inorganic film 14 were set to be the same as the corresponding configurations of the organic EL element in the above-mentioned Example 1. In addition, the organic EL element of the example was also produced in the same way as in the above-mentioned Example 1.

Example 7

In Example 7, the inorganic film 14 was constituted of an SiNx film having a thickness of 2000 nm. In the organic EL element in the example, configurations other than that of the inorganic film 14 were set to be the same as the corresponding configurations of the organic EL element in the above-mentioned Example 1. In addition, the organic EL element of the example was also produced in the same way as in the above-mentioned Example 1.

Example 8

In Example 8, the cathode 13 was constituted of an Al film having a thickness of 1000 nm, and the inorganic film 14 was constituted of an SiNx film having a thickness of 1000 nm. Further, in the example, the adhesive layer 3 was formed of an acrylic resin. In the organic EL element of the example, configurations other than those of the cathode 13, the inorganic film 14 and the adhesive layer 3 were set to be the same as the corresponding configurations of the organic EL element in the above-mentioned Example 1. In addition, the organic EL element of the example was also produced in the same way as in the above-mentioned Example 1.

Comparative Example

In order to make comparisons with the performance in various Examples described above, an organic EL element of a configuration not provided with the adhesive layer 3 and the sealing base material 4 (Comparative Example) was produced. That is, in the organic EL element in Comparative Example, a configuration in which the organic compound layer 12 was sealed with two layers of the cathode 13 and inorganic film 14 (two-layer sealing configuration) was employed.

Furthermore, in Comparative Example, the cathode 13 was constituted of an Al film having a thickness of 1000 nm and the inorganic film 14 was constituted of an SiNx film having a thickness of 1000 nm. In the organic EL element main body 2 of the organic EL element of the example, configurations other than those of the cathode 13 and the inorganic film 14 were set to be the same as the corresponding configurations in the above-mentioned Example 1.

[Characteristic Evaluation of Organic EL Element]

(1) Evaluation Technique

A dark spot (DS) test and a flexibility test were carried out for each of the organic EL elements produced in various Examples and Comparative Example described above. Specifically, an initial dark spot test, the flexibility test and a time-dependent dark spot test described below were carried out for each of organic EL elements in this order.

First, in the initial dark spot test, an organic EL element immediately after the production was lighted and in the state, the generation percentage (generation ratio: initial DS generation ratio) of a dark spot (spot-like non light-emitting portion) area was examined. Meanwhile, the dark spot generation ratio was obtained by taking a photograph of the light-emitting surface of the organic EL element and subjecting the image data to a prescribed image processing. In addition, the lighting of the organic EL element was carried out using a constant-voltage power source and a direct-current voltage of 5 V was applied to one dot of the organic EL element.

Meanwhile, in the initial dark spot test, a determination of the measured dark spot generation ratios was made on the basis of the standard of 4 grades (A, B, C, D) described below to evaluate the light-emitting performance of the organic EL element.

A evaluation: dark spot generation ratio is 0% (dark spot is not generated at all)

B evaluation: dark spot generation ratio is more than 0% and less than 5%

C evaluation: dark spot generation ratio is 5% or more and less than 10%

D evaluation: dark spot generation ratio is 10% or more

Next, the flexibility test was carried out for each of the organic EL elements after the initial dark spot test. Specifically, the organic EL element was wound on a surface of a cylindrical member having a diameter of 100 mm, with the light-emitting surface of the organic EL element facing outward, and the state was kept for 10 seconds. Then, the action was repeated three times and after that, the external appearance of the organic EL element was visually observed.

Meanwhile, in the flexibility test, the observation results of the light-emitting surface of the organic EL elements were determined on the basis of the standard of 3 grades (A, B, C) described below and the flexibility of the organic EL elements was evaluated.

A evaluation: no change occurred in external appearance (light-emitting surface)

B evaluation: cracks are generated in a part of external appearance (light-emitting surface)

C evaluation: defects such as cracks are generated over the entire surface of external appearance (light-emitting surface)

Then, after storing each of the organic EL elements for 500 hours after the flexibility test under environmental conditions of temperature of 85° C. and relative humidity of 90% RH, the dark spot generation ratio (time-dependent DS generation ratio) was again checked (time-dependent dark spot test).

Meanwhile, in the time-dependent dark spot test, a determination of the measured dark spot generation ratios was made in the same way as in the initial dark spot test on the basis of the standard of the 4 grades (A, B, C, D) mentioned above to evaluate the light-emitting performances of the organic EL elements.

(2) Evaluation Results

The evaluation results of various tests carried out for various organic EL elements produced in the various Examples and Comparative Example described above are shown in FIG. 4.

As is clear from FIG. 4, considering comprehensively both results of the dark spot test and the flexibility test, it was found that better characteristics were able to be obtained than those of Comparative Example (two-layer sealing configuration), by adopting the configuration of sealing the organic compound layer 12 with the cathode 13, the inorganic film 14 and the adhesive layer 3, that is, the three-layer sealing configuration as in the organic EL element 1 in the present embodiment. In particular, it was found that excellent characteristics were able to be obtained in all the characteristics of light emission characteristics, weather resistance (light emission stability) thereof and flexibility by setting the thickness of the inorganic film 14 to be around about 200 nm.

Furthermore, as is clear from the results of Examples 1 to 4, it was found that characteristics excellent in the light emission characteristics, weather stability (light emission stability) thereof and flexibility were able to be obtained according to the configuration of the organic EL element 1 in the present embodiment, irrespective of the formation material and formation technique of the cathode 13 and the formation material of the inorganic film 14.

REFERENCE SIGNS LIST

1: organic EL element, 2: organic EL element main body, 3: adhesive layer, 4: sealing base material, 10: element substrate, 11: anode, 12: organic compound layer, 13: cathode, 14: inorganic film, 15: inorganic insulation film, 20: planar light-emitting unit, 21: support substrate, 22: adhesion member

The invention claimed is:

1. An organic electroluminescent element, comprising:
an element substrate;
a first electrode formed on the element substrate;
an organic compound layer that is formed on the first electrode and includes a light-emitting layer;
a second electrode provided so as to cover the organic compound layer;
an inorganic insulation film that is formed on a prescribed area within a non light-emitting area of the first electrode and is formed between the first electrode and the second electrode;
an inorganic film provided so as to cover the second electrode;
a sealing resin layer provided so as to cover the inorganic film; and
a sealing base material provided on the sealing resin layer, wherein the first electrode has an upper surface and a side surface, and
the sealing resin layer covers both the upper surface and the side surface of the first electrode.

2. The organic electroluminescent element according to claim 1, wherein
both the element substrate and the sealing base material are constituted of a flexible base material.

3. The organic electroluminescent element according to claim 1, wherein
a thickness of the inorganic film has a value of less than 1 µm.

4. The organic electroluminescent element according to claim 3, wherein
the thickness of the inorganic film has a value in the range of 100 nm to 250 nm.

5. The organic electroluminescent element according to claim 1, wherein
the inorganic film is constituted of a transparent inorganic film.

6. The organic electroluminescent element according to claim 5, wherein
the inorganic film is constituted of a silicon oxide film.

7. The organic electroluminescent element according to claim 1, wherein
the sealing resin layer is formed of a heat-curable resin.

8. The organic electroluminescent element according to claim 7, wherein
the heat-curable resin is an epoxy-based resin.

9. The organic electroluminescent element according to claim 1, wherein
the second electrode is a transparent electrode.

10. A planar light-emitting unit, comprising:
a plurality of organic electroluminescent elements; and
a support member that supports the plurality of organic electroluminescent elements arranged in a prescribed form, wherein
the organic electroluminescent element has an element substrate, a first electrode formed on the element substrate, an organic compound layer that is formed on the first electrode and includes a light-emitting layer, a second electrode provided so as to cover the organic compound layer, an inorganic insulation film that is formed on a prescribed area within a non light-emitting area of the first electrode and is formed between the first electrode and the second electrode, an inorganic film provided so as to cover the second electrode, a sealing resin layer provided so as to cover the inorganic film, and a sealing base material provided on the sealing resin layer,
wherein the first electrode has an upper surface and a side surface, and
the sealing resin layer covers both the upper surface and the side surface of the first electrode.

\* \* \* \* \*